United States Patent
Ni et al.

(10) Patent No.: US 10,827,612 B2
(45) Date of Patent: Nov. 3, 2020

(54) PRINTED CIRCUIT BOARD AND ELECTRICAL CONNECTOR ASSEMBLY USING THE SAME

(71) Applicant: ALLTOP ELECTRONICS (SUZHOU) LTD., Suzhou, Jiangsu Province (CN)

(72) Inventors: Mindi Ni, Suzhou (CN); Yichang Chen, New Taipei (TW)

(73) Assignee: ALLTOP ELECTRONICS (SUZHOU) LTD., Suzhou (CN)

(*) Notice: Subject to any disclaimer, the term of this patent is extended or adjusted under 35 U.S.C. 154(b) by 0 days.

(21) Appl. No.: 16/408,454

(22) Filed: May 9, 2019

(65) Prior Publication Data
US 2019/0373726 A1 Dec. 5, 2019

(30) Foreign Application Priority Data

Jun. 1, 2018 (CN) .......................... 2018 1 0556982
Oct. 24, 2018 (CN) ..................... 2018 2 1730509 U
Oct. 24, 2018 (CN) ..................... 2018 2 1732499 U

(51) Int. Cl.
| | |
|---|---|
| *H05K 1/11* | (2006.01) |
| *H01R 12/53* | (2011.01) |
| *H01B 7/00* | (2006.01) |
| *H01B 7/02* | (2006.01) |
| *H01B 7/04* | (2006.01) |
| *H01B 7/08* | (2006.01) |
| *H01B 7/22* | (2006.01) |
| *H01B 7/295* | (2006.01) |
| *H01B 11/00* | (2006.01) |

(Continued)

(52) U.S. Cl.
CPC ........... *H05K 1/111* (2013.01); *H01B 7/0054* (2013.01); *H01B 7/0208* (2013.01); *H01B 7/0225* (2013.01); *H01B 7/0241* (2013.01); *H01B 7/04* (2013.01); *H01B 7/0853* (2013.01); *H01B 7/205* (2013.01); *H01B 7/228* (2013.01); *H01B 7/295* (2013.01); *H01B 11/00* (2013.01); *H01B 11/203* (2013.01); *H01R 12/53* (2013.01); *H01B 7/0823* (2013.01); *H05K 1/117* (2013.01); *H05K 2201/094* (2013.01); *H05K 2201/09027* (2013.01); *H05K 2201/10356* (2013.01)

(58) Field of Classification Search
CPC .... H05K 1/111; H01B 7/0054; H01B 7/0208; H01B 7/0225; H01B 7/0241; H01B 7/04
USPC .......................................................... 174/255
See application file for complete search history.

(56) References Cited

U.S. PATENT DOCUMENTS

2011/0199165 A1* 8/2011 Yeh .................. H05K 1/025 333/1
2015/0253897 A1* 9/2015 Liang .................. G06F 3/044 345/174

* cited by examiner

*Primary Examiner* — Tremesha S Willis
(74) *Attorney, Agent, or Firm* — Cheng-Ju Chiang

(57) ABSTRACT

A printed circuit board comprises a substrate and a routing structure arranged on the substrate, the substrate has a welding region and a routing region electrical connected with the welding region. The routing structure comprises a plurality of bonding pads connected with corresponding wires and a plurality of conductive traces electrically connected with the bonding pads, the bonding pads is arranged in the welding region, and the conductive traces are disposed in both the welding region and the routing region. The bonding pads are arranged abreast, and in the arrangement direction of the bonding pads, the bonding pads defines at (Continued)

least two grounding pads for connecting with grounding wires and at least a signal pad between the two grounding pads.

15 Claims, 5 Drawing Sheets

(51) Int. Cl.
*H01B 7/20* (2006.01)
*H01B 11/20* (2006.01)

PRINTED CIRCUIT BOARD AND ELECTRICAL CONNECTOR ASSEMBLY USING THE SAME

CROSS REFERENCE TO RELATED APPLICATIONS

The present application claims the priority of Chinese Patent Application No. 201810556982.0 filed on Jun. 1, 2018, Chinese Patent Application No. 201821730509.1 filed on Oct. 24, 2018 and Chinese Patent Application No. 201821732499.5 filed on Oct. 24, 2018, the contents of which are hereby incorporated by reference into this application.

BACKGROUND

1. Technical Field

The present disclosure relates to a printed circuit board, and more particularly to a printed circuit board having higher transmission efficiency and an electrical connector assembly using the same.

2. Description of Related Art

A printed circuit board can be disposed in an electronic device for soldering with an electronic component and building an electrical connection therebetween. And in general, the printed circuit board is provided with a plurality of golden fingers or bonding pads on an outer surface thereof, and the golden fingers or bonding pads are electrically connected with conductive traces inside the printed circuit board. The printed circuit board is welded with an electrical connector or a cable via the golden fingers or bonding pads, thus can realize a transmission or processing of input or output signals from the electrical connector or the cable. However, with the diversify and complexity of electronic device, the transmission or processing of input or output signals from the electrical connector or the cable is easily disturbed with a lower processing efficiency.

It is desirable to provide an improved printed circuit board and an electrical connector assembly for solving above problems.

SUMMARY

In one aspect, the present invention includes a printed circuit board comprising a substrate and a routing structure arranged on the substrate, the substrate has a welding region and a routing region electrical connected with the welding region, the routing structure comprising a plurality of bonding pads connected with corresponding wires and a plurality of conductive traces electrically connected with the bonding pads, the bonding pads are arranged in the welding region, and the conductive traces are disposed in both the welding region and the routing region. The bonding pads are arranged abreast, and in the arrangement direction of the bonding pads, the bonding pads defines at least two grounding pads for connecting with grounding wires and at least a signal pad between the two grounding pads.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

The components in the drawing are not necessarily drawn to scale, the emphasis instead being placed upon clearly illustrating the principles of the described embodiments. In the drawings, reference numerals designate corresponding parts throughout various views, and all the views are schematic.

DETAILED DESCRIPTION OF THE ILLUSTRATED EMBODIMENT

Figure 1:
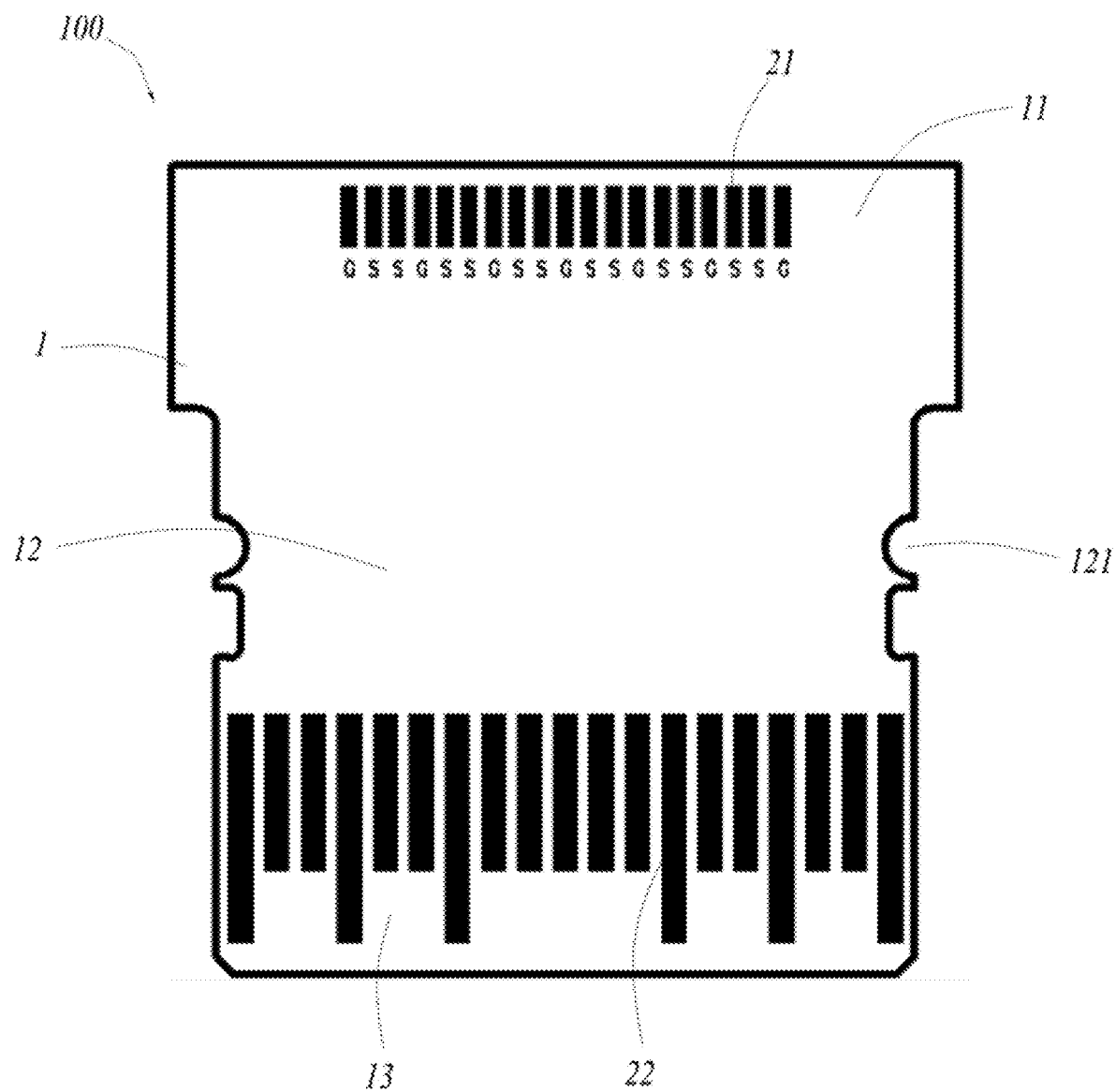
FIG. 1 is a top view of a printed circuit board in accordance with a first embodiment of the present disclosure.

Reference will now be made to the drawing figures to describe the embodiments of the present disclosure in detail. In the following description, the same drawing reference numerals are used for the same elements in different drawings.

The present disclosure discloses a printed circuit board, and the printed circuit board can be used in various electronic equipments such as computer, switch or charging device, and mainly for the transmission of electrical signals.

Referring to FIG. 1, a first illustrated embodiment of the present disclosure discloses a printed circuit board 100 comprising a substrate 1 and a routing structure arranged on the substrate 1.

The substrate 1 has a thickness in the range of 0.5 mm to 1.7 mm. The substrate 1 comprises at least a welding region 11 and a routing region 12 electrical connected with the welding region 11. The welding region 11 is adjacent to the routing region 12 along a length direction of the substrate 1. In the present embodiment, in the length direction of the substrate 1, the substrate 1 further defines a contacting region 13 on a side of the routing region 12 far away from the welding region 11. At least a pair of positioning slots 121 are disposed on both sides of the routing region 12 to limit the printed circuit board 100 or other electronic components (not shown).

Figure 4:
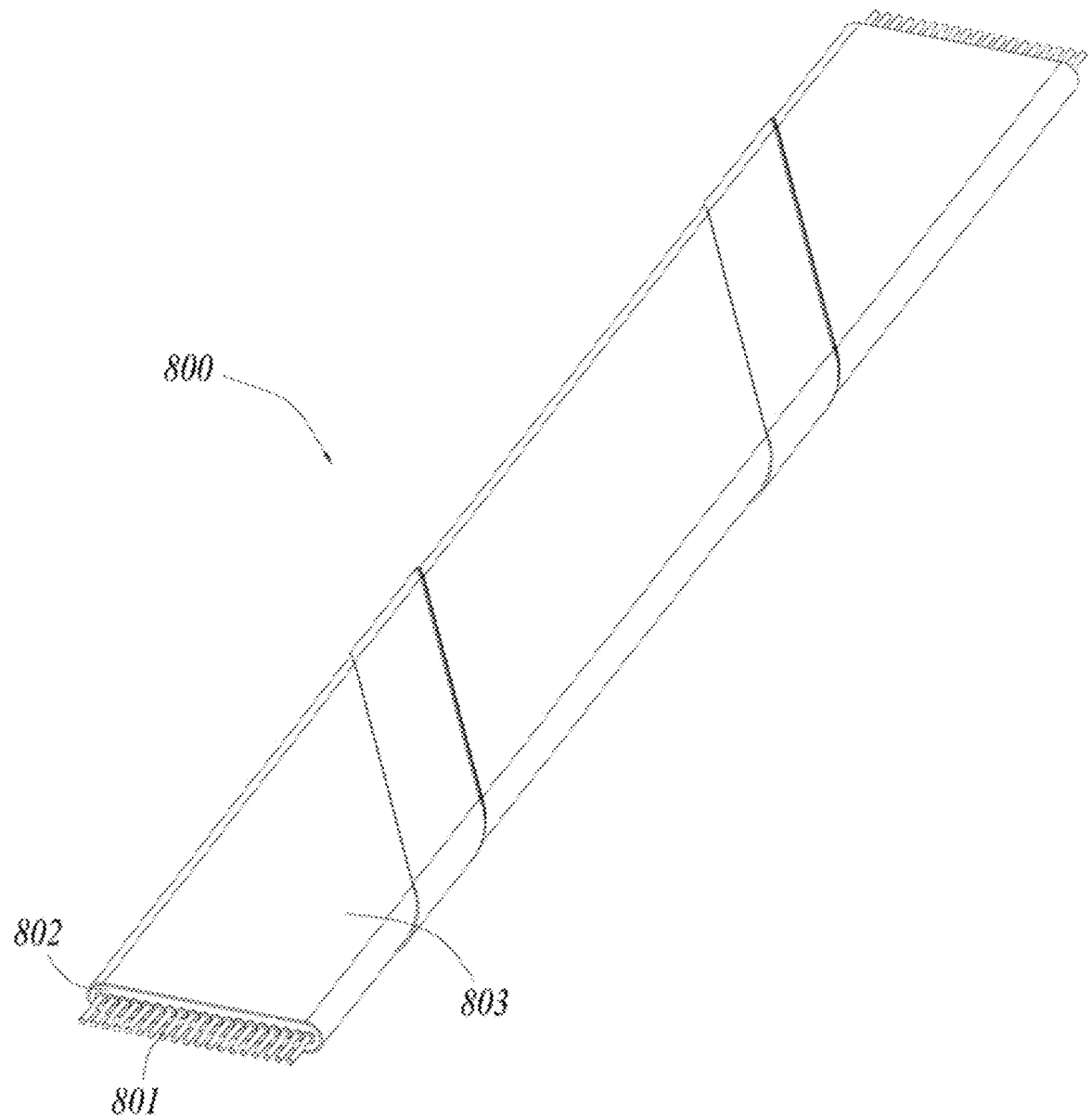
FIG. 4 is a perspective view of a data transmission cable used for connecting with the printed circuit board of the present disclosure.

Conjunction with FIG. 4, the routing structure includes at least a plurality of bonding pads 21 connected with corresponding wires 801 and a plurality of conductive traces (not shown) electrically connected with the bonding pads 21. The bonding pads 21 are arranged in the welding region 11, and the conductive traces are disposed in both the welding region 11 and the routing region 12. In the present embodiment, the routing structure also has a plurality of golden fingers 22 disposed on the contacting region 13.

In the present embodiment, the contacting region 13 with golden fingers 22 can be directly served as a tongue portion of an electrical connector (not shown), that is to say, the contacting region 13 is mating with a complementary connector to realize signal transmission therebetween. In addition, the golden fingers 22 also can be soldered with contacts (not shown) of a connector, to form an electrical conjunction between the wires 801 and the connector, and realize signal transmission and processing.

Figure 5:
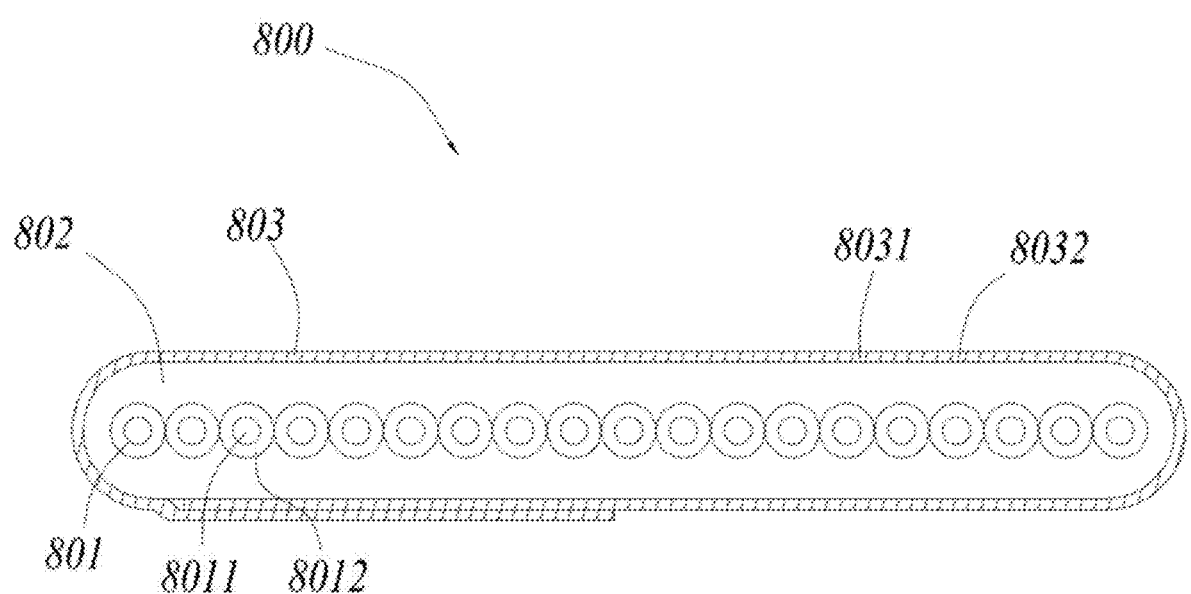
FIG. 5 is a front view of the data transmission cable shown in FIG. 4.

Referring to FIGS. 4 to 5, a data transmission cable 800 soldering with the printed circuit board 100 comprises several juxtaposed wires 801, a plastic layer 802 enclosing on the wires 801 integrally and a metallic layer 803 formed by a metal material belt arranged on an outer side of the plastic layer 802 in a spiral winding way. The metallic layer 803 has at least an aluminum foil layer 8031 and a bonding layer 8032 arranged on the side of the aluminum foil layer 8031 facing to the plastic layer 802. The metallic layer 803 is bonded to the outer side of the plastic layer 802 after hot melting the bonding layer 8032.

On the one hand, the metallic layer 803 can twine around the plastic layer 802 closely, on the other hand, the bonding layer arranged on the side of the aluminum foil layer 8031 facing to the plastic layer 802, the metallic layer 803 can not only be fixed on the outer side of the plastic layer 802 directly by bonding, thus the whole of data transmission cable 800 can be made more thinner and more softer, but also air can be discharged when bonding, and as bonding, the discharged air cannot enter again, so as to achieve a dense effect and an intimate enclosing, therefore the data transmission cable 800 can be made more softer and more lightweight with a high frequency transmission performance.

The wires 801 are disposed in an equally spaced arrangement, and each wire 801 has an outer diameter same as a center distance between every two neighboring wires 801. In further, each wire 801 has a conductor 8011 and an insulative cladding layer 8012 enclosing on the conductor 8011. In other embodiment, the wire 801 also cannot be provided with the cladding layer 8012, that is, the plastic layer 802 is directly enclosing on the wires 801, and the same effect can be achieved.

The cladding layer 8012 is made of same or similar material as the plastic layer 802, and preferably made of high density polyethylene, thus to ensure the bonding strength of the adjacent layers of the data transmission cable 800 and the whole flexibility. In addition, it is preferable to use plastic material whose dielectric coefficient is close to air, so that the impedance of cladding layer 8012 and plastic layer 802 can be reduced, and a better signal transmission environment is provided for the conductors 8011, signal propagation delays and crosstalk between signals can be reduced, thus it can ensure high-speed and effective transmission of signals, and reduce signal attenuation. The conductor 8011 has an outer diameter (traditionally expressed in AWG size) in the range of 31 to 34 American Wire Gauge (AWG), and the ratio of the center distance between every two neighboring wires 801 to the outer diameter of the conductor 8011 is in the range of 1.4 to 2.8.

Furthermore, the bonding pads 21 are arranged abreast, and in the arrangement direction of the bonding pads 21, the bonding pads 21 define at least two grounding pads G for connecting with grounding wires and at least a signal pad S between the two grounding pads G, in this way, the noise around the signal pad S can be eliminated by the grounding pad G, and signal transmission of the signal pad S can be guaranteed, thereby improving the efficiency of signal transmission and processing.

Furthermore, the golden fingers 22 are arranged abreast along a direction parallel to the arrangement direction of the bonding pads 21. Both each bonding pad 21 and each golden finger 22 have a width extending along the arrangement direction thereof and a length extending along a direction perpendicular to the arrangement direction. The welding region 11, the routing region 12 and the contacting region 13 are arranged in sequence along a length direction of the bonding pad 21 and the golden finger 22.

Referring to FIG. 1, in the present embodiment, only two signal pads S are defined between two neighboring grounding pads G, and the two signal pads S between two neighboring grounding pads G are formed a signal pad pair for differential signal transmission. Specially, the bonding pads 21 only have grounding pads G and signal pad pairs, and the number of grounding pads G is one more than that of the signal pad pairs.

Further, in the present embodiment, in the arrangement direction of the bonding pads 21, the two bonding pads 21 on both sides are grounding pads G, and a signal pad pair is arranged between every two neighboring grounding pads G. Conjunction with FIG. 1, the bonding pads 21 comprise seven grounding pads G and six signal pad pairs in present embodiment, the arrangement of the golden fingers 22 is matched with the arrangement of the bonding pads 21, thus, the printed circuit board 100 in the present embodiment can be adapted to Slimline SAS standard, then is suitable for the corresponding signal transmission.

Furthermore, a length of a conventional bonding pad is usually more than 2 mm, but in the present invention, each bonding pad 21 is defined with a length extending along the direction perpendicular to the arrangement direction not more than 1.5 mm, preferably less than 1.3 mm, and further preferably less than 1.1 mm. It is to say, the length of the bonding pad 21 is shortened as much as possible, thereby reducing the stripping length of the corresponding wire 801 and the welding length with the bonding pad 21 after stripping of the wire 801. Furthermore, when transmitting high frequency signal, the impedance discontinuity can be further shortened and the high frequency characteristics can be more stable.

Preferably, in present embodiment, the area of each bonding pad 21 occupying the welding region 11 is less than 0.39 mm$^2$, and preferably, the ratio of the length of each bonding pad 21 to the width of each bonding pad 21 is less than 5.8. When the area is constant, the shape of each bonding pad 21 is close to a square by minimizing the ratio of the length to the width of the bonding pad 21 as much as possible, thus the bonding pad 21 has a smaller length, thereby decreasing the distance of impedance discontinuity, and an appropriate width of each bonding pad 21 can ensure the stability of welding with the wire.

In the present invention, the width of each bonding pad 21 is less than 0.28 mm, to guarantee the space between two adjacent bonding pads 21. Preferably, the width of each bonding pad 21 is greater than the outer diameter of conductor 8011. The distance between two adjacent bonding pads 21 is not less than 0.13 mm, so two adjacent wires can be welding to the corresponding bonding pads 21 conveniently and the problems of mutually bonding or short-circuit welding due to small spacing can be avoided.

In the present embodiment, the bonding pads 21 are disposed in an equally spaced arrangement, and the center distance between every two neighboring bonding pads 21 is defined in the range of 0.30 mm to 0.42 mm. The setting of the bonding pads 21 is matched the spacing setting of the data transmission cable 800, thus, without stretching or bending the wires 801 of the data transmission cable 800, the wires 801 can be directly soldering to the bonding pads 21 in a one-to-one relationship, so as to facilitate the connection between the wires 801 and the bonding pads 21. Further, the stripping length required for each wire 801 is reduced, the impedance discontinuity can be shortened and the high frequency characteristics can be more stable.

Additionally, in the length direction of the bonding pad 21, each bonding pad 21 has a first edge close to the routing region 12 and a second edge far away from the routing region 12. The distance between the second edge and an edge of the welding region 11 far away from the routing region 12 is less than 1 mm. Furthermore, in the length direction of the bonding pad 21, the distance between the first edge and the edge of the welding region 11 far away from the routing region 12 is preferably not greater than 2 mm, the distance of impedance discontinuity can be shortened and the high frequency signal transmission can be guaranteed.

The overall layout design in the first embodiment of the printed circuit board 100 of the present invention is as mentioned above, and noise around the signal pads S can be effectively eliminated to guarantee signal transmission of signal pads S, and then the efficiency of signal transmission and processing can be improved. Moreover, the dimension setting of the bonding pads 21 can facilitate the welding of the data transmission cable 800, shorten the distance of impedance discontinuity as much as possible, and ensure the stability of the high frequency characteristics of high frequency signal transmission.

Figure 2:
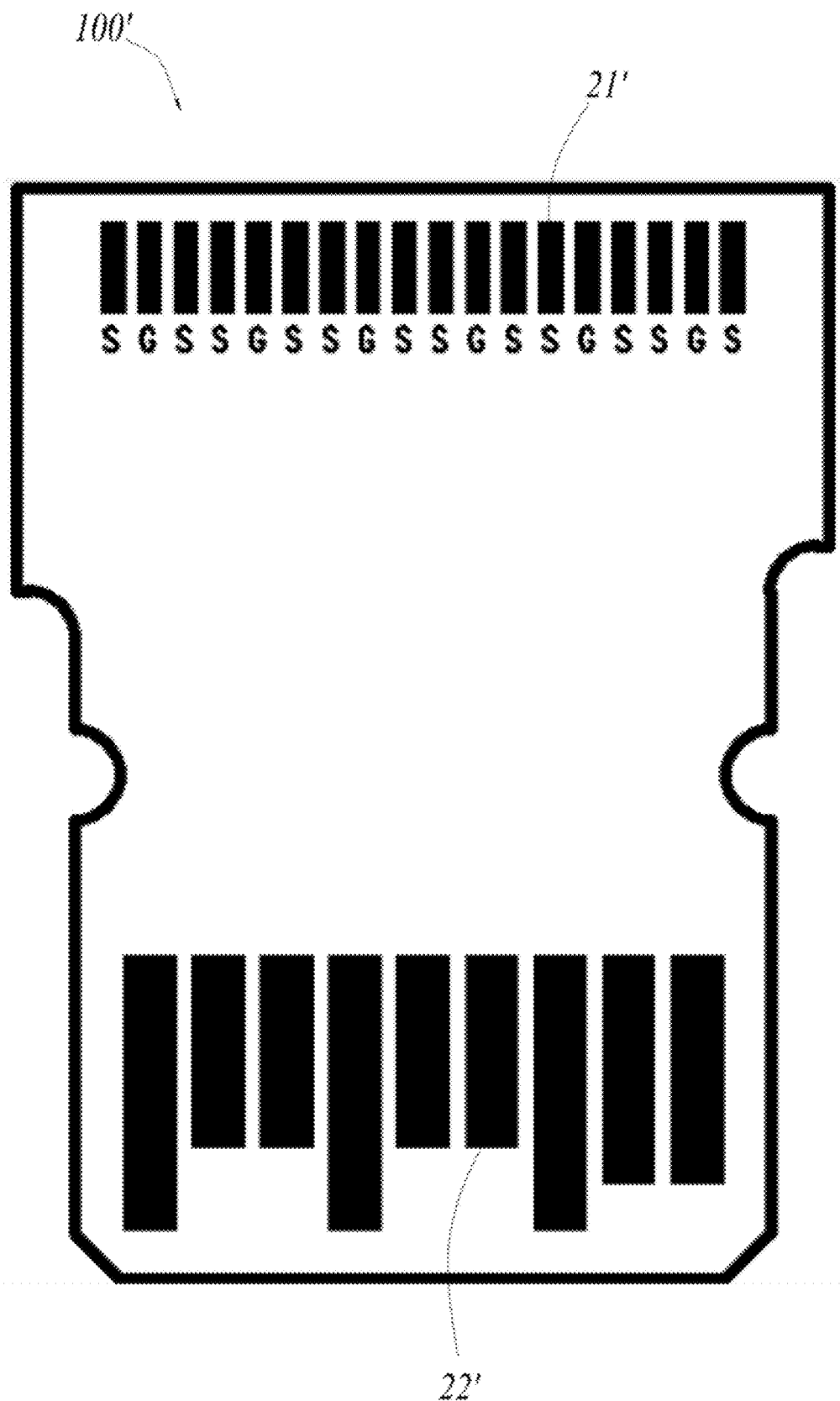
FIG. 2 is a top view of a printed circuit board in accordance with a second embodiment of the present disclosure.

FIG. 2 illustrates a printed circuit board 100' according to a second embodiment of the present invention, and the printed circuit board 100' has a similar configuration as the printed circuit board 100 in the first embodiment of present invention, so the same description as the printed circuit board 100 is omitted here, and detailed description for the difference is as follows.

In the present embodiment, the numbers of the bonding pads 21' and the golden fingers 22' are different from the first embodiment. Specially, the number of the signal pads S is twice as that of the grounding pads G, and the signal pads S include several signal pad pairs and a pair of single-ended signal pads, each signal pad pair is arranged between every two neighboring grounding pads G for transmitting differential signal, the single-ended signal pads are defined on outer sides of the grounding pads G. Further, in the arrangement direction of the bonding pads 21', the two bonding pads 21' on lateral sides are signal pads S.

Figure 3:
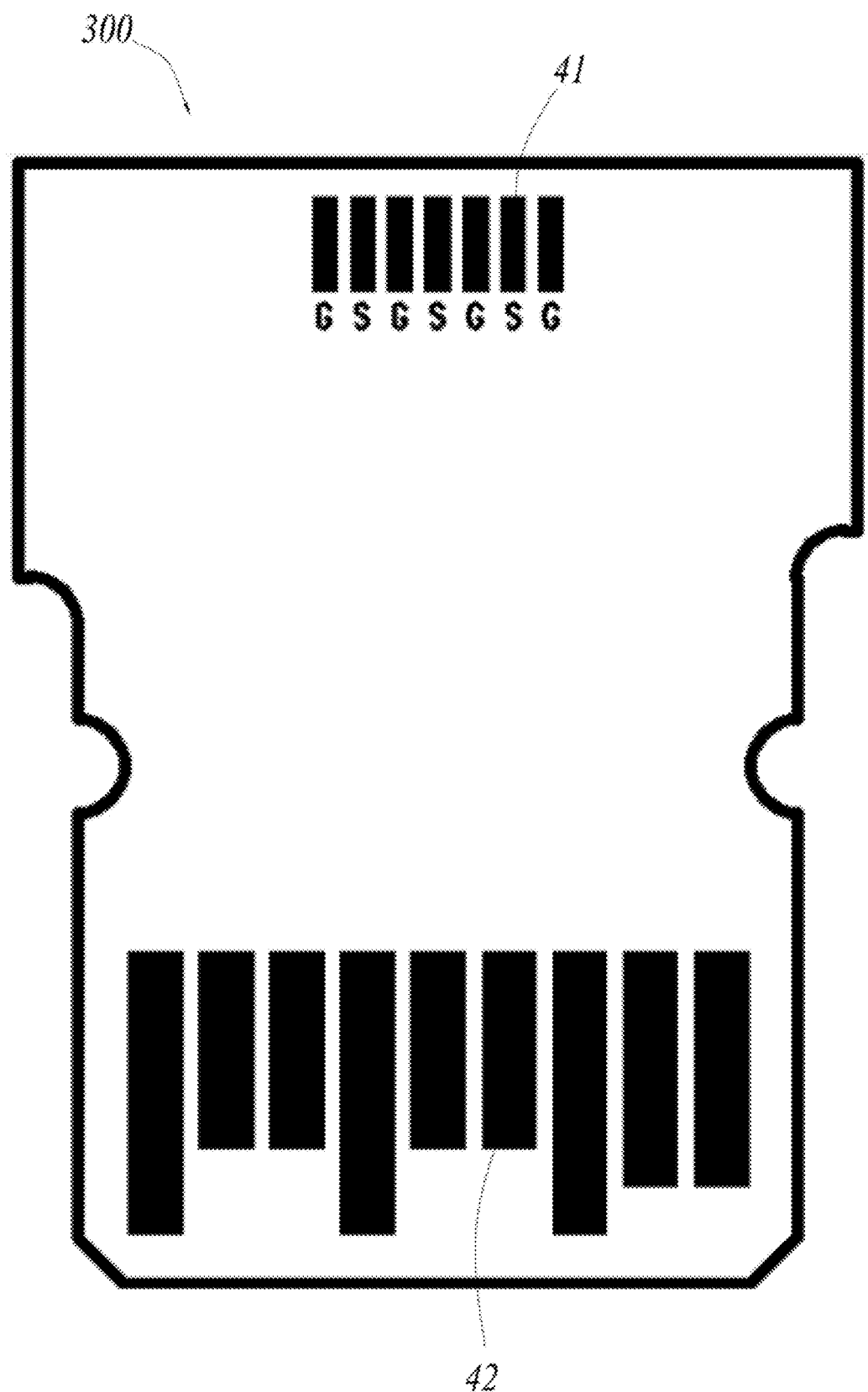
FIG. 3 is a top view of a printed circuit board in accordance with a third embodiment of the present disclosure.

FIG. 3 illustrates a printed circuit board 300 according to a third embodiment of the present invention, and the printed circuit board 300 has a similar configuration as the printed circuit board 100 in the first embodiment of present invention, so the same description as the printed circuit board 100 is omitted here, and detailed description for the difference is as follows.

In the present embodiment, the numbers of the bonding pads 41 and the golden fingers 42 are different from the first embodiment. Specially, the number of the grounding pads G is one more than that of the signal pads S, and the signal pads S only include a plurality of single-ended signal pads, the signal pads S and the grounding pads G are arranged alternately. Further, in the arrangement direction of the bonding pads 41, the two bonding pads 41 on both sides are grounding pads G.

Combining with aforementioned description, the present invention also relates to an electrical connector assembly, and the electrical connector assembly comprises the printed circuit board 100, 100', 300 and the data transmission cable 800 soldering with the printed circuit board 100, 100', 300. The arrangement of wires 801 in the data transmission cable 800 is matched with the bonding pads 21, 21', 41 on the printed circuit board 100, 100', 300 respectively. The data transmission cable 800 has a butted segment soldering with the bonding pads 21, 21', 41, after the metallic layer 803, the plastic layer 802 and the cladding layer 8012 are removed partially, the conductors 8011 are exposed to form the butted segment, thus the conductors 8011 are soldering with the bonding pads 21, 21', 41.

Combining with aforementioned settings of the bonding pads 21, 21', 41, the length of the butted segment of the data transmission cable 800 formed by removing the metallic layer 803, the plastic layer 802 and the cladding layer 8012 is not greater than 2 mm. Further, the center distance between every two neighboring wires 801 is defined according to the center distance between every two neighboring bonding pads 21, 21', 41, and in the range of 0.30 mm to 0.42 mm, thus the wires 801 of the data transmission cable 800 can be directly soldered with the relative bonding pads 21, 21', 41.

It is to be understood, however, that even though numerous characteristics and advantages of preferred and exemplary embodiments have been set out in the foregoing description, together with details of the structures and functions of the embodiments, the disclosure is illustrative only; and that changes may be made in detail within the principles of present disclosure to the full extent indicated by the broadest general meaning of the terms in which the appended claims are expressed.

What is claimed is:

1. An electrical connector assembly, comprising:
    a printed circuit board having a substrate and a routing structure arranged on the substrate, the substrate having a welding region and a routing region electrically connected with the welding region, the routing structure comprising a plurality of bonding pads for connecting with corresponding wires, the bonding pads being arranged in the welding region, the bonding pads arranged abreast, and in an arrangement direction of the bonding pads, the bonding pads defining at least two grounding pads for connecting with grounding wires and at least a signal pad between two grounding pads out of the at least two grounding pads; and
    a data transmission cable soldering with the printed circuit board, and comprising several juxtaposed wires, a plastic layer enclosing on the wires integrally and a metallic layer formed by a metal material belt arranged on an outer side of the plastic layer in a spiral winding way, each wire having a conductor, the metallic layer having at least an aluminum foil layer and a bonding layer arranged on the side of the aluminum foil layer facing to the plastic layer, the metallic layer bonded to the outer side of the plastic layer after hot melting the bonding layer;
    wherein the wires are soldered with corresponding bonding pads, the center distance between every two neighboring wires is same as the center distance between every two neighboring bonding pads.

2. The electrical connector assembly as claimed in claim 1, wherein in the length direction of the bonding pad, each bonding pad has a first edge close to the routing region and a second edge far away from the routing region, the data transmission cable has a butted segment formed by conductors being exposed, the butted segment is soldering with the bonding pads, and the length of the butted segment is corresponding to the distance between the first edge and the edge of the welding region far away from the routing region, and not greater than 2 mm.

3. The electrical connector assembly as claimed in claim 1, wherein the conductor has an outer diameter in the range of 31 to 34 AWG, the wires and the bonding pads are disposed in an equally spaced arrangement respectively, the center distance between every two neighboring bonding pads and that of two neighboring wires are defined in the range of 0.30 mm to 0.42 mm.

4. The electrical connector assembly as claimed in claim 1, wherein the width of each bonding pad is less than 0.28 mm, and the distance between two adjacent bonding pads is not less than 0.13 mm.

5. The electrical connector assembly as claimed in claim 2, wherein the welding region is adjacent to the routing region along the length direction of the bonding pad, and in the length direction of the bonding pad, the distance between the second edge and an edge of the welding region far away from the routing region is less than 1 mm.

6. The electrical connector assembly as claimed in claim 1, wherein only two signal pads are defined between two neighboring grounding pads, and the two signal pads between two neighboring grounding pads form a signal pad pair for differential signal transmission.

7. The electrical connector assembly as claimed in claim 6, wherein the bonding pads only have grounding pads and signal pad pairs, and the number of grounding pads is one more than that of the signal pad pairs.

8. The electrical connector assembly as claimed in claim 7, wherein in the arrangement direction of the bonding pads, two bonding pads on both sides of the plurality of bonding pads are grounding pads, and a signal pad pair is arranged between every two neighboring grounding pads.

9. The electrical connector assembly as claimed in claim 6, wherein the number of the signal pads is twice as that of the grounding pads.

10. The electrical connector assembly as claimed in claim 9, wherein two signal pads are defined on outer sides of the grounding pads, in the arrangement direction of the bonding pads, two bonding pads on lateral sides of the plurality of bonding pads are signal pads.

11. The electrical connector assembly as claimed in claim 1, wherein the number of the grounding pads is one more than that of the signal pads.

12. The electrical connector assembly as claimed in claim 11, wherein in the arrangement direction of the bonding pads, two bonding pads on both sides of the plurality of bonding pads are grounding pads.

13. The electrical connector assembly as claimed in claim 1, wherein each bonding pad has a width extending along the arrangement direction thereof and a length extending along a direction perpendicular to the arrangement direction, and the length of each bonding pad is less than 1.5 mm.

14. The electrical connector assembly as claimed in claim 13, wherein the area of each bonding pad occupying the welding region is less than 0.39 mm$^2$.

15. The electrical connector assembly as claimed in claim 14, wherein the ratio of the length of each bonding pad to the width of each bonding pad is less than 5.8.

* * * * *